United States Patent
Gandy

[19]

[11] Patent Number: 5,995,032
[45] Date of Patent: Nov. 30, 1999

[54] ANALOG/DIGITAL CONVERTER WITH AUTOMATIC CONTROL FOR CONTROLLING OFFSET AND GAIN

[75] Inventor: Philippe Gandy, Thaon, France

[73] Assignee: U.S. Philips Corporation, New York, N.Y.

[21] Appl. No.: 09/094,832

[22] Filed: Jun. 15, 1998

[30] Foreign Application Priority Data

Jun. 17, 1997 [FR] France .................................. 97 07512

[51] Int. Cl.$^6$ .................................................. H03M 1/66
[52] U.S. Cl. .......................................... 341/144; 341/118
[58] Field of Search .................................... 341/144, 155, 341/118, 154

[56] References Cited

U.S. PATENT DOCUMENTS

| | | | |
|---|---|---|---|
| 4,523,232 | 6/1985 | Kameda et al. | 358/236 |
| 5,594,373 | 1/1997 | McClure et al. | 327/108 |
| 5,596,297 | 1/1997 | McClure et al. | 327/538 |

FOREIGN PATENT DOCUMENTS 58-25717A   2/1983   Japan .

*Primary Examiner*—Brian Young
*Assistant Examiner*—Peguy JeanPierre
*Attorney, Agent, or Firm*—Steven R. Biren

[57] ABSTRACT

The circuit, arranged between a source of higher voltage (VCC) and a source of lower voltage (ground), comprises an analog/digital converter (ADC) which has a resistor ladder (RL) connected between a top terminal (Vtop), a bottom terminal (Vbot) for supplying a series of reference voltages. According to the invention, this circuit includes a bias generator arrangement formed by a resistor (Rmid) connected on one side to the supply voltage source and on the other side to a reference current source (Ip0), and automatic control means (A2) for controlling a variable impedance element (T5) inserted between the connection (Vbot) at the bottom of the ladder and ground, which automatic control means are suitable for controlling the voltage (FS) at the terminals of the resistor ladder.

7 Claims, 1 Drawing Sheet

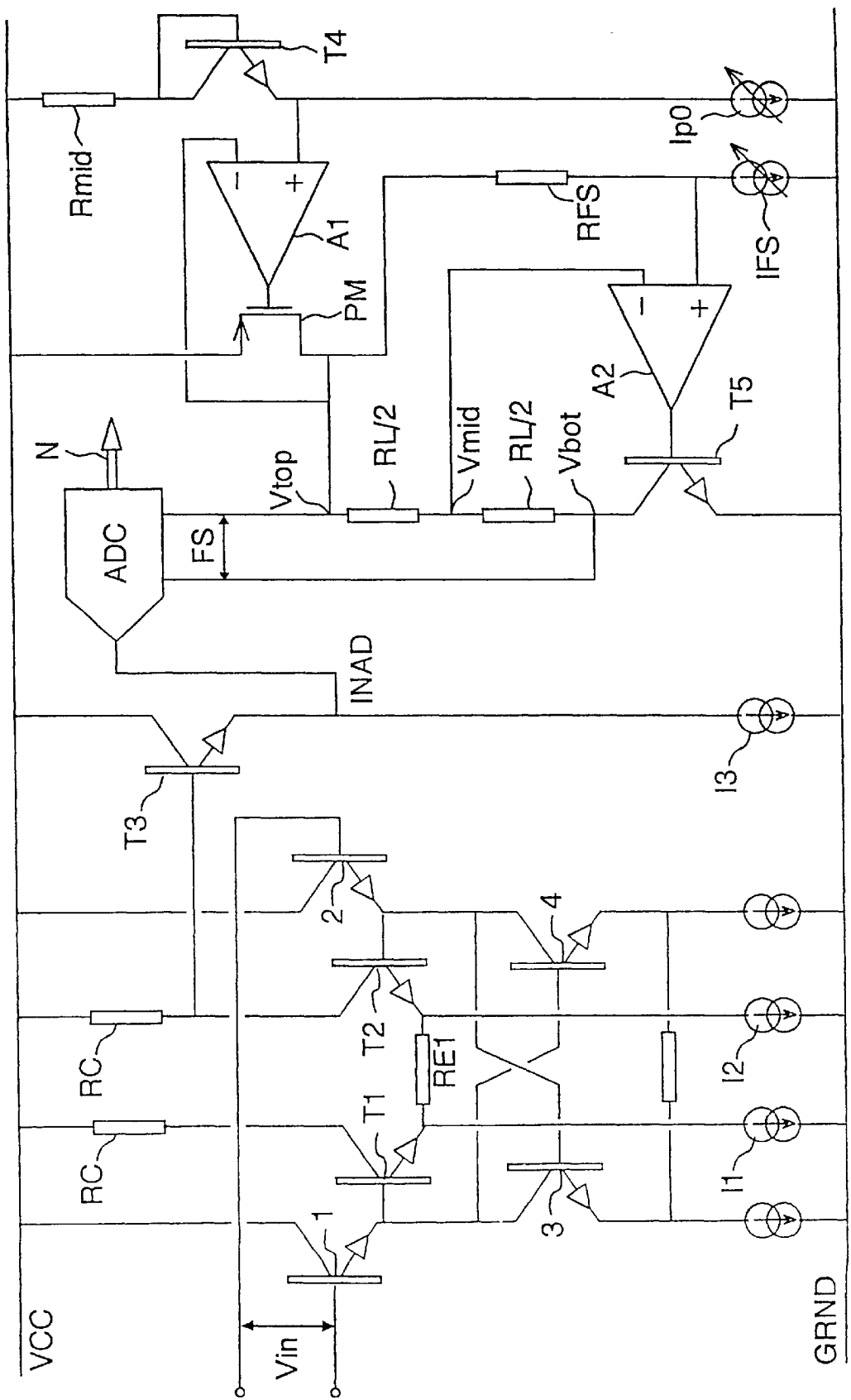

5,995,032

1
ANALOG/DIGITAL CONVERTER WITH AUTOMATIC CONTROL FOR CONTROLLING OFFSET AND GAIN

BACKGROUND OF THE INVENTION

The present invention relates to an integrated circuit for being arranged between a source of higher voltage and a source of lower voltage, including reference current sources and an analog/digital converter with a resistor ladder connected between a terminal called top terminal and a terminal called bottom terminal for producing a series of reference voltages, the bottom terminal being connected to the source of lower voltage via a variable voltage element.

Such a circuit is used when one seeks to quantify an analog voltage, for example, in medical imaging in the domain of oscilloscopes and digital communication, notably television.

An analog/digital converter such as mentioned above is known from patent abstract JP-A-58-25717. In the analog/digital converter described in this document, the bottom terminal is connected to the source of lower voltage via an element that introduces a variable offset voltage, and for providing the influence of the fluctuation of this offset voltage, the high voltage is produced by a fixed voltage source connected to the bottom terminal.

SUMMARY OF THE INVENTION

It is an object of the invention to avoid the conversion being degraded if the high voltage or the current sources vary.

For this purpose, the circuit includes a bias generator assembly inserted between the source of higher voltage and the top terminal, and automatic control means for controlling the variable voltage element so as to control the voltage on the terminals of the resistor ladder.

Advantageously, the automatic control means comprise a comparator for comparing a voltage that represents the voltage on the resistor ladder terminals with the voltage on a terminal of a resistor whose other terminal is connected to the top terminal and through which the current of a reference current source flows.

The gain of the analog/digital conversion is kept constant in this manner.

Preferably, said voltage representing the voltage on the terminals of the resistor ladder is tapped from a middle point of the resistor ladder.

Advantageously, the bias generator assembly comprises a resistor connected on one side to the source of higher voltage and on the other side to a reference current source.

Thus, the voltage corresponding to the full scale of the converter may be copied from that obtained in an input amplifier circuit, the resistors and voltage sources there being of the same type.

Advantageously, the bias generator assembly comprises a diode connected in series to the resistor.

Thus, the voltage corresponding to the full scale of the converter varies with temperature as the voltage of an input amplifier circuit.

In a particular embodiment, the bias generator assembly further has an output amplifier.

Advantageously, said output amplifier comprises an operational amplifier followed by a field effect transistor, the whole being arranged with unity gain.

Accordingly, the potential corresponding to the full scale of the converter may come very near to the higher voltage.

2
BRIEF DESCRIPTION OF THE DRAWINGS

These aspects of the invention and other, more detailed aspects will appear moye clearly from the following description of an embodiment forming a non-limiting example.

The sole FIGURE represents in a diagram a circuit which comprises an input stage followed by an analog/digital converter.

DESCRIPTION OF THE PREFERRED EMBODIMENTS

The circuit represented by the FIGURE is fed between a supply voltage source called source of higher voltage VCC and a source of lower voltage GRND, ground here. The input voltage Vin is applied to a differential input stage having two symmetrical transistors 1, 2 of the NPN type, arranged as followers. The emitters of these transistors are connected each to a reference current source via the main current path of a transistor 3, 4 respectively. The base of the transistor 3 is connected to the collector of the transistor 4, and vice versa. This stage feeds another differential assembly formed by two NPN-type transistors T1 and T2 arranged each with a collector load RC, whose emitters are connected to each other via a resistor R1 and which are fed each by a reference current source I1, I2, respectively. The assembly comprising the transistors 1 to 4 and T1, T2 is known per se and does not need a more elaborate description.

These stages are followed by an NPN transistor T3 arranged as a follower and charged by a reference current source I3. The signal coming from this stage T3 is applied to the input INAD of an analog/digital converter ADC which produces an digitized signal of N bits.

The analog/digital converter ADC habitually comprises a resistor ladder for producing a series of diverse reference voltages, each being tapped from the node of two successive resistors of the ladder and compared with the input signal by means of a comparator. To simplify the FIGURE, this has not been represented because it is known per se.

The resistor ladder here comprises two halves RL/2 which are represented here underneath the converter ADC. The ladder is connected between a terminal Vtop called top terminal and a terminal Vbot called bottom terminal, the bottom terminal being connected to ground via an element that introduces a variable voltage, here an NPN transistor T5 arranged as a common-emitter transistor: its collector is connected to the terminal Vbot and its emitter is connected to ground.

The assembly includes a bias generator assembly inserted between the supply voltage source VCC and the top terminal Vtop; it comprises for creating a voltage:

a first resistor Rmid through which the current from a reference current source Ip0 passes, a diode connected in series to the resistor Rmid; the diode is formed here by an NPN transistor T4 arranged as a diode, an operational amplifier A1 whose "+" input is connected to the emitter of the transistor T4, whose output is connected to the gate of a P-channel field effect transistor PM whose drain is connected to the supply voltage and whose source is connected to the terminal Vtop; the whole is arranged as unity gain because of the looping back from the source of the PM transistor to the "−" input of the amplifier A1.

The element T5 which introduces a variable voltage is controlled by the output of a comparator A2 which compares a voltage that represents the voltage on the terminals of the resistor ladder applied to its "−" input with the voltage on the terminals of a second resistor RFS through which a reference current flows which is produced by a source IFS. The resistor RFS is connected on one side to the top terminal Vtop and on the other side to the "+" input of the amplifier A2. The voltage on the terminals of the resistor ladder is represented here by a voltage Vmid taken from a tap of the node of the ladder between the two halves RL/2. Obviously, another position may also be used for the tap.

The sources Ip0 and IFS may be programmable, for regulating the offset and gain respectively, of the converter. However, it is advantageous for the source Ip0 and the source I3 to be as similar as possible to ensure a perfect compensation of temperature of the base-emitter voltages of the transistors T3 and T4.

With the tap in the middle of the ladder, the voltage FS on the terminals of the ladder is equal to $$FS = 2 \times RFS \times IFS$$

while it is supposed that the amplifier A2 is perfect (infinite gain and zero input impedance).

The value of the voltage INAD depends on the value of the reference current sources I1, I2, I3. In the event of a drift of these current sources, there may be admitted as a first approximation that all the sources including Ip0 and IFS drift in the same fashion and the amplitudes of the voltage FS and INAD will continue to be matched.

Furthermore, the DC component of INAD is determined by the voltage I2×RC added to the base-emitter voltage drop in the transistor T3 and it is compensated by the voltage Ip0×Rmid added to the base-emitter voltage drop in the transistor T4.

What is claimed is:

1. An integrated circuit for being arranged between a source of higher voltage and a source of lower voltage, including reference current sources and an analog/digital converter with a resistor ladder connected between a terminal called top terminal and a terminal called bottom terminal for producing a series of reference voltages, the bottom terminal being connected to the source of lower voltage via a variable voltage element, characterized in that the circuit includes a bias generator assembly inserted between the source of higher voltage and the top terminal, and automatic control means for controlling the variable voltage element so as to control the voltage on the terminals of the resistor ladder.

2. An integrated circuit as claimed in claim 1, characterized in that the automatic control means comprise's a comparator for comparing a voltage that represents the voltage on the resistor ladder terminals with the voltage on a terminal of a resistor whose other terminal is connected to the top terminal and through which the current of a reference current source flows.

3. An integrated circuit as claimed in claim 2, characterized in that said voltage representing the voltage on the terminals of the resistor ladder is tapped from a middle point of the resistor ladder.

4. An integrated circuit as claimed in claim 1, characterized in that the bias generator assembly comprises a resistor connected on one side to the source of higher voltage and on the other side to a reference current source.

5. An integrated circuit as claimed in claim 4, characterized in that the bias generator assembly comprises a diode connected in series to the resistor.

6. An integrated circuit as claimed in claim 4, characterized in that the bias generator assembly further includes an output amplifier.

7. An integrated circuit as claimed in claim 6, characterized in that said output amplifier comprises an operational amplifier followed by a field effect transistor, the whole being arranged for unity gain.

* * * * *